(12) United States Patent
Rhe et al.

(10) Patent No.: US 10,976,870 B2
(45) Date of Patent: Apr. 13, 2021

(54) DISPLAY DEVICE WITH INORGANIC FILM AND METHOD OF FABRICATING THE SAME

(71) Applicant: LG Display Co., Ltd., Seoul (KR)

(72) Inventors: Ruda Rhe, Seoul (KR); JiHyun Jung, Gyeonggi-do (KR); Yangsik Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/169,125

(22) Filed: Oct. 24, 2018

(65) Prior Publication Data

US 2019/0131562 A1 May 2, 2019

(30) Foreign Application Priority Data

Oct. 27, 2017 (KR) ........................ 10-2017-0141360

(51) Int. Cl.
*G06F 3/044* (2006.01)
*H01L 51/52* (2006.01)
*H01L 51/56* (2006.01)
*H01L 27/32* (2006.01)
*G09F 9/30* (2006.01)
*G09G 3/3225* (2016.01)
*G06F 3/041* (2006.01)
(Continued)

(52) U.S. Cl.
CPC ............ *G06F 3/044* (2013.01); *G06F 3/0412* (2013.01); *G06F 3/0446* (2019.05); *G06F 3/04164* (2019.05); *G09F 9/301* (2013.01); *G09G 3/3225* (2013.01); *H01L 27/1248* (2013.01); *H01L 27/3246* (2013.01); *H01L 27/3276* (2013.01); *H01L 51/5203* (2013.01); *H01L 51/524* (2013.01); *H01L 51/5253* (2013.01); *H01L 51/56* (2013.01); *H01L 27/323* (2013.01); *H01L 51/0097* (2013.01)

(58) Field of Classification Search
CPC .. G06F 3/0446; G06F 3/04164; G06F 3/0412; G06F 3/044; H01L 51/524; H01L 51/5203; H01L 51/5253; H01L 51/56; H01L 51/0097; H01L 27/1248; H01L 27/3246; H01L 27/3276; H01L 27/323; G09G 3/3225; G09F 9/301
See application file for complete search history.

(56) References Cited

U.S. PATENT DOCUMENTS

2015/0268775 A1* 9/2015 Yu ........................ H01L 51/5253
345/173
2017/0262109 A1* 9/2017 Choi ....................... G06F 3/0412
(Continued)

*Primary Examiner* — Lisa S Landis
(74) *Attorney, Agent, or Firm* — Morgan, Lewis & Bockius LLP

(57) ABSTRACT

A display device and a method of fabricating the same. An active area having pixels defined therein is provided on a substrate. A pad area is provided on the substrate to receive signals to be transferred to the active area. A wiring area is provided on the substrate, with electrical lines being disposed therein to connect the active area and the pad area. An inorganic film is disposed in the active area and the wiring area, with a thickness of the inorganic film, located in the wiring area, is lower than a thickness of the inorganic film, located in the active area. Electrical lines are prevented from being broken in a bendable structure intended for a narrow bezel.

14 Claims, 15 Drawing Sheets

(51) Int. Cl.
*H01L 27/12* (2006.01)
*H01L 51/00* (2006.01)

(56) References Cited

U.S. PATENT DOCUMENTS

2019/0102005 A1* 4/2019 Matsumoto ........... H01L 27/323
2019/0341442 A1* 11/2019 Kajiyama ................. G09F 9/00

* cited by examiner

DISPLAY DEVICE WITH INORGANIC FILM AND METHOD OF FABRICATING THE SAME

CROSS REFERENCE TO RELATED APPLICATION

This application claims priority to Korean Patent Application No. 10-2017-0141360, filed on Oct. 27, 2017, which is hereby incorporated by reference for all purposes as if fully set forth herein.

BACKGROUND

Technical Field

The present disclosure relates to a display device and a method of fabricating the same.

Description of Related Art

In response to the development of the information society, demand for a variety of display devices for displaying images is increasing. In this regard, a range of display devices, such as liquid crystal display (LCD) devices, plasma display devices, and organic light-emitting diode (OLED) display devices, have come into widespread use.

Display devices can operate in response to instructions input by users using a variety of user interfaces or input devices, such as a keyboard, a mouse, and the like. Touchscreen panels allowing users to intuitively and conveniently input user instructions to display devices by touching screens have also been developed as input systems of display devices. A touchscreen panel is disposed on the screen of a display device, allowing a user to input an instruction to the display device by touching a specific point of the screen of the display device.

Such display devices generally use a narrow bezel to improve the aesthetic appearance and reduce the size. In this regard, the width of the bezel may be reduced by designating a non-active area to be located below an active area when a substrate is bent, with a pad part by which signals are input to a display device being disposed in the non-active area. However, when such a substrate is bent, electric wires disposed on the substrate may be broken. The width of electrical lines may be increased to prevent electrical lines from being broken. However, it is difficult to apply electrical lines having an increased width to high resolution applications.

SUMMARY

Accordingly, embodiments of the present disclosure are directed to a display device and method of fabricating the same that substantially obviate one or more of the problems due to limitations and disadvantages of the related art.

Various aspects of the present disclosure provide a display device and a method of fabricating the same, by which electrical lines can be prevented from being broken in a bendable structure intended for a narrow bezel.

Also provided are a display device and a method of fabricating the same, which can be used for high-resolution applications.

Also provided are a display device including a touch sensing circuit and a method of fabricating the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device may comprise: an active area provided on a substrate and having pixels defined therein; a pad area provided on the substrate to receive signals to be transferred to the active area; and a wiring area provided on the substrate, with electrical lines being disposed therein to connect the active area and the pad area. An inorganic film may be disposed in the active area and the wiring area, with a thickness of a portion of the inorganic film, located in the wiring area, being lower than a thickness of a portion of the inorganic film, located in the active area.

In another aspect, a display device may comprise: a substrate having defined thereon an active area and a wiring area, wherein a first inorganic film is disposed in the active area and the wiring area, the first inorganic film in the wiring area being patterned, such that the wiring area includes a first area in which the first inorganic film is not disposed and a second area in which the first inorganic film is disposed; a transistor disposed in the active area; a light-emitting layer connected to the transistor; and a sealing substrate sealing the light-emitting layer.

In another aspect, a method of fabricating a display device may comprise: fabricating electrical lines in a wiring area on a substrate on which a first inorganic film is provided; etching the wiring area in which the electrical lines are fabricated, thereby etching the first inorganic film; and fabricating a first organic film on the electrical lines.

According to exemplary embodiments, the display device and the method of fabricating the same can prevent electrical lines from being broken in a bendable structure intended for a narrow bezel.

According to exemplary embodiments, the display device and the method of fabricating the same can be used for high-resolution applications.

According to exemplary embodiments, the display device including a touch sensing circuit and the method of fabricating the same are provided.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1A:
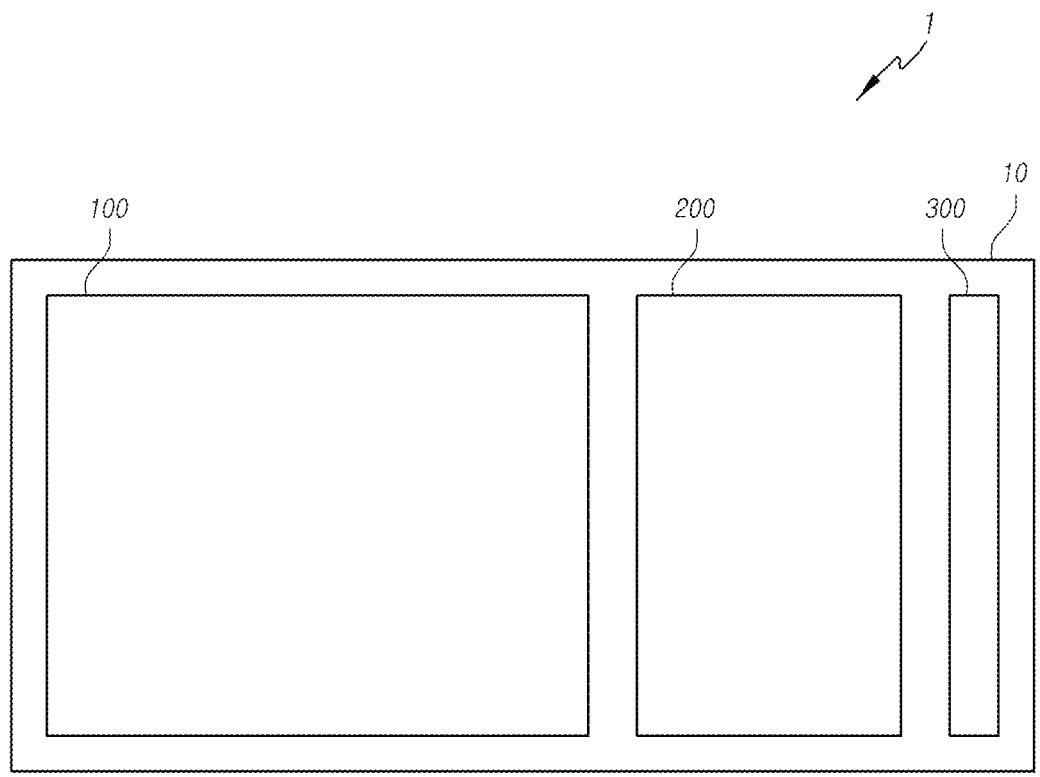
FIG. 1A is a plan view illustrating a display device according to exemplary embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are merely used to distinguish one element from other elements. The substance, sequence, order, or number of such elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly located on or under another element, but it can also be indirectly located on or under another element via an intervening element.

Figure 1B:
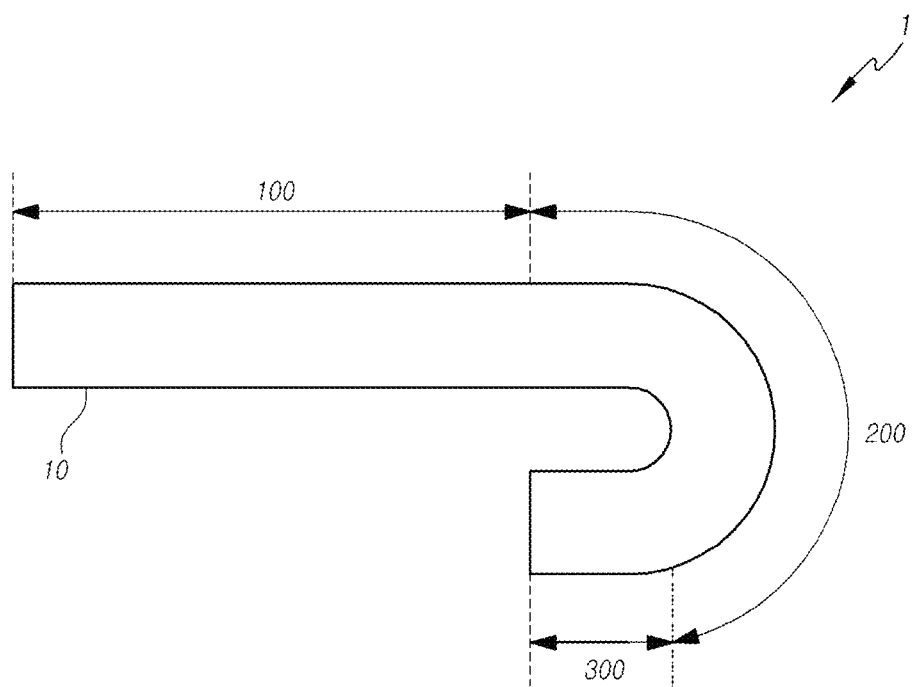
FIG. 1B is a side elevation view illustrating the display device according to exemplary embodiments.

FIG. 1A is a plan view illustrating a display device according to exemplary embodiments, while FIG. 1B is a side elevation view illustrating the display device according to exemplary embodiments.

Referring to FIGS. 1A and 1B, the display device 1 includes, on a substrate 10, an active area 100 including a plurality of pixels to display images thereon, a bendable wiring area 200, and a pad area 300 applying signals and voltages to the active area 100. An area in which the wiring area 200 and the pad area 300 are provided may be referred to as a non-active area.

Figure 2:
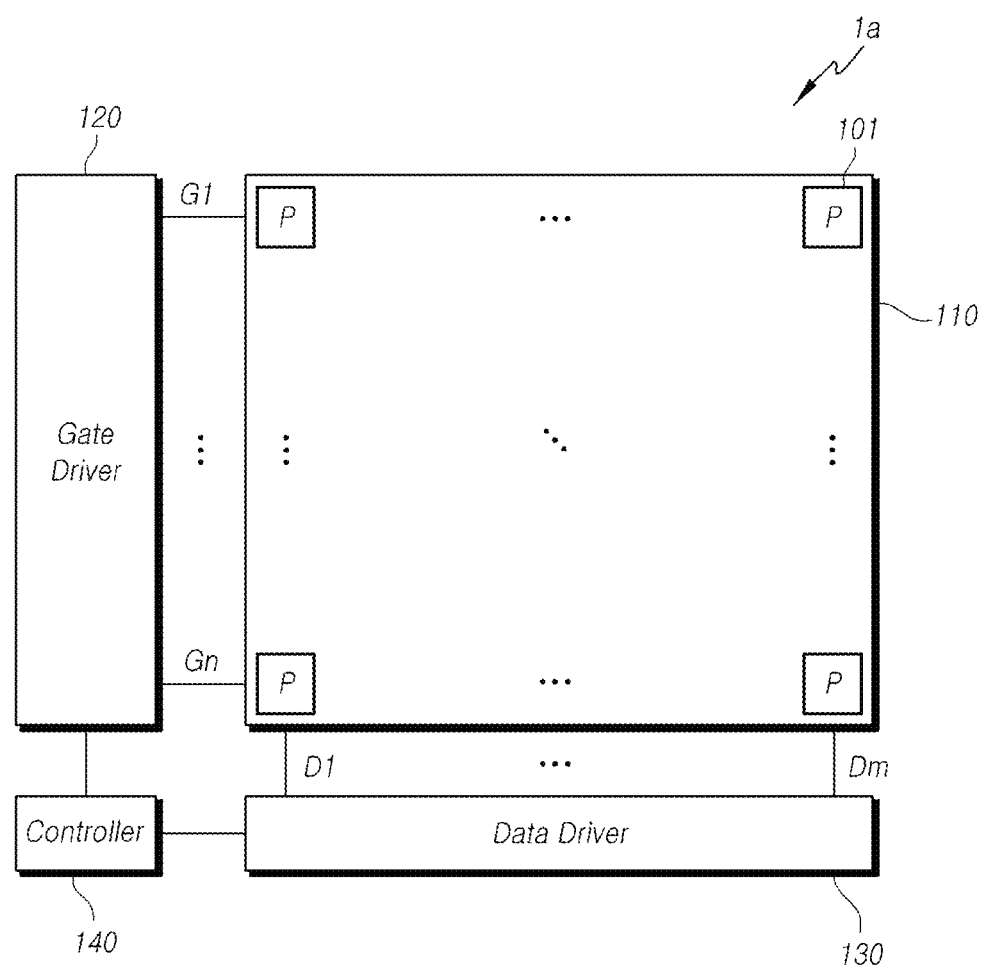
FIG. 2 is a block diagram illustrating the configuration of the display device according to exemplary embodiments.
Figure 4:
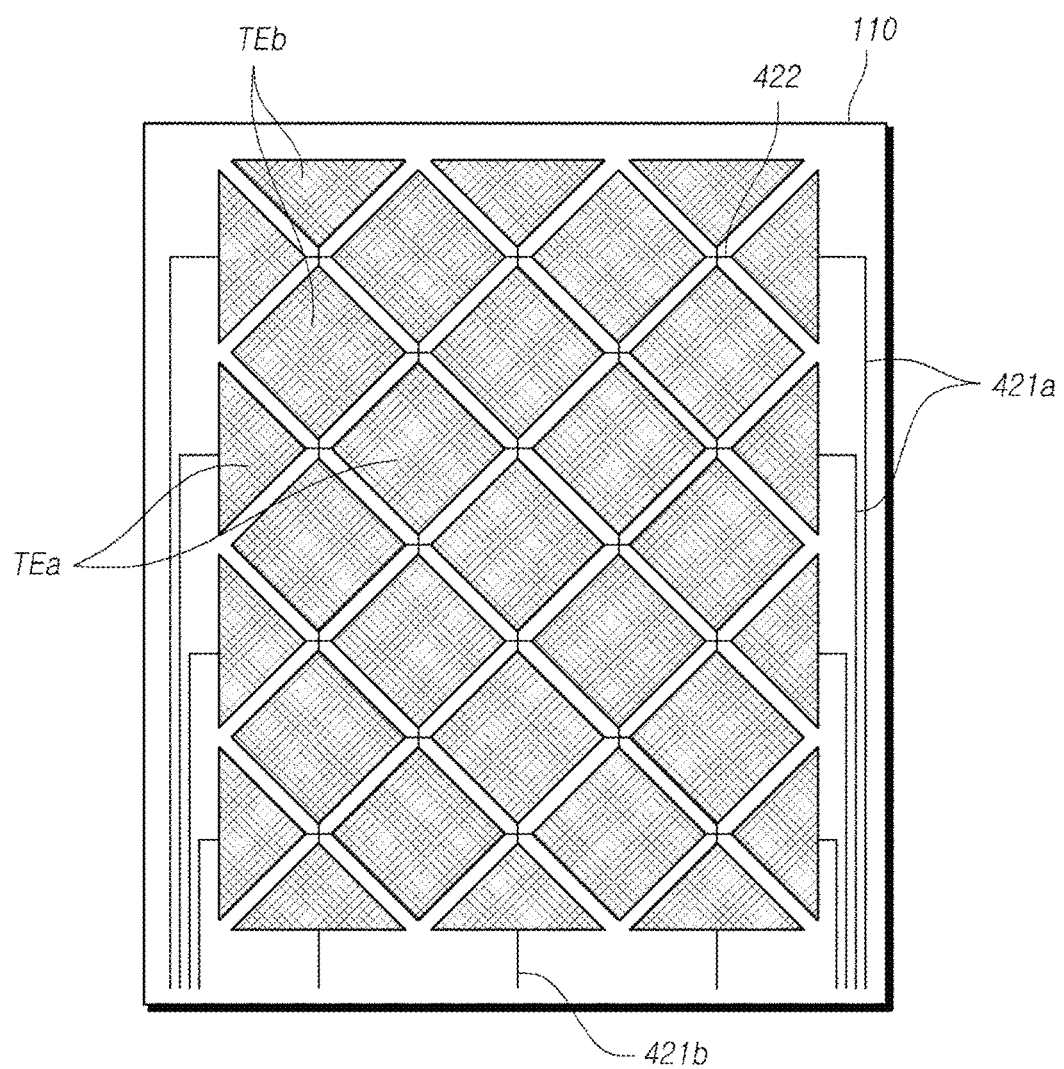
FIG. 4 is a plan view illustrating an exemplary touch sensing circuit used in the display device according to exemplary embodiments.
Figure 5:
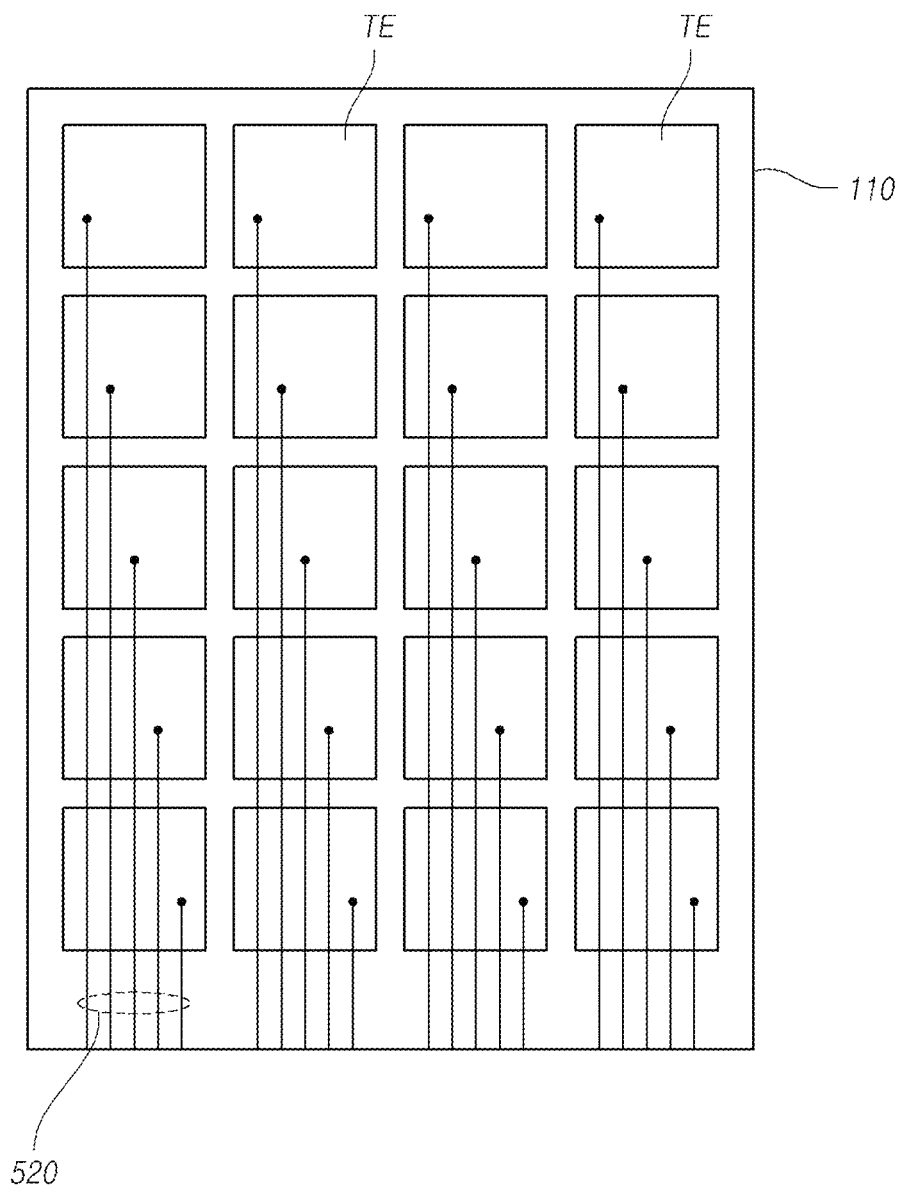
FIG. 5 is a plan view illustrating another exemplary touch sensing circuit used in the display device according to exemplary embodiments.
Figure 6:
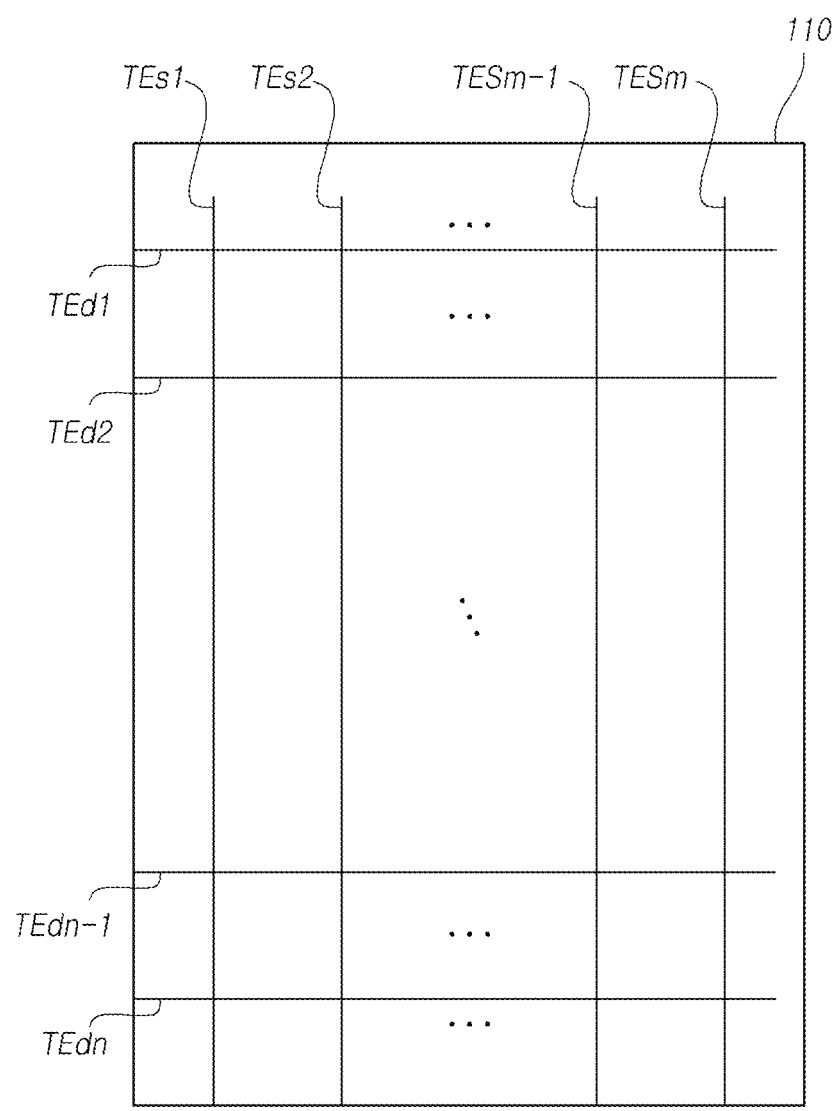
FIG. 6 is a plan view illustrating another exemplary touch sensing circuit used in the display device according to exemplary embodiments.

In addition, a display panel 110 illustrated in FIG. 2 may be disposed in the active area 100. A plurality of pads, to which a gate driver 120 and a data driver 130 illustrated in FIG. 2 are connected, may be disposed in the pad area 300. A plurality of pads connected to power lines may be disposed in the pad area 300. In addition, when a touch sensing circuit illustrated in FIGS. 4 to 6 is disposed in the active area 100, a plurality of pads, through which signals of a touch driver (not shown) driving the touch sensing circuit are transferred, may be disposed in the pad area 300. However, the present disclosure is not limited thereto. A printed circuit board (PCB), on which the data driver, the gate driver, a touch driver (not shown), and the like are mounted, may be connected to the plurality of pads. The plurality of pads may include pads to which voltages are supplied.

When the wiring area 200 of the substrate 10 is bent, the pad area 300 is located below the substrate 10. Accordingly, the width of the bezel in this case may be narrower than in the case in which the pad area 300 is not located below the substrate 10. To help the wiring area 200 to be bent on the substrate 10, the thickness of an inorganic layer disposed on the substrate 10 may be lower when located in the wiring area 200 than in the active area 100.

FIG. 2 is a block diagram illustrating the configuration of the display device according to exemplary embodiments.

Referring to FIG. 2, the display device 100 may include a display panel 110, a gate driver 120, a data driver 130, and a controller 140.

The display panel 110 may include a plurality of pixels 101 disposed in areas in which a plurality of gate lines G1, . . . , and Gn intersect a plurality of data lines D1, . . . , and Dm. Each of the pixels 101 may include an organic light-emitting diode (OLED) and a pixel circuit (not shown) supplying driving current to the OLED. The pixel circuit can generate driving current by receiving a data signal flowing through the data lines D1, . . . , and Dm, in response to a gate signal transferred through the gate lines G1, . . . , and Gn, and supply the data signal to the OLED. In addition, the display panel 110 may be driven by a plurality of voltages transferred thereto. The plurality of voltages transferred to the display panel 110 may include a first voltage EVDD and a second voltage EVSS, the voltage level of which is lower than the voltage level of the first voltage EVDD. Due to the first voltage EVDD and the second voltage EVSS, driving current may flow through the display panel 110. In addition, the display panel 110 may include nXm number of pixels. The first voltage EVDD may be supplied to the pixels according to pixel row, i.e. in a row specific manner, while the second voltage EVSS may be a common voltage supplied to all of the plurality of pixels 101.

The gate driver 120, connected to the plurality of gate lines G1, . . . , and Gn, can transfer a gate signal to the plurality of gate lines G1, . . . , and Gn. Although a single gate driver 120 is illustrated, the present disclosure is not limited thereto and a plurality of gate drivers may be provided. In addition, the gate drivers 120 may be provided on both sides of the display panel 110, with the gate driver 120 on the left side being connected to odd-numbered gate lines among the plurality of gate lines G1, . . . , and Gn, and the gate driver 120 on the right side being connected to even-numbered gate lines among the plurality of gate lines G1, . . . , and Gn. However, the present disclosure is not limited thereto.

The data driver 130, connected to the plurality of data lines D1, . . . , and Dm, can transfer data signals to the plurality of data lines D1, . . . , and Dm. Although a single data driver 130 is illustrated, the present disclosure is not limited thereto and a plurality of data drivers may be provided. The number of the data driver 130 may be determined by the size and resolution of the display panel 110. The data driver 130 can sense driving current flowing through the pixels 101. Although single row of pixels may be connected to one data line among the plurality of data lines D1, . . . , and Dm, the present disclosure is not limited thereto.

The controller 140 can control the gate driver 120 and the data driver 130. The controller 140 can transfer a clock signal and a synchronization signal to the gate driver 120. The signals that the controller 140 transfers to the gate driver 120 are not limited thereto. The controller 140 can transfer an image signal, a clock signal, and a synchronization signal to the data driver 130. In addition, the controller 140 can control a plurality of voltages in the display panel 110. Furthermore, the controller 140 can control the first voltage EVDD to be transferred to the gate driver 120 and a voltage to be transferred to the data driver 130, based on which the data driver 130 controls the second voltage. No voltage may be supplied to the display panel 110, the gate driver 120, and the data driver 130, under the control of the controller 140.

In addition, the gate driver 120 and the data driver 130 may be provided as integrated circuits (ICs), and may be mounted on a PCB (not shown). The PCB may be connected to the pad part 300 illustrated in FIG. 1, such that signals output from the gate driver 120 and the data driver 130 are transferred to the display panel 110. In addition, the controller 140 may be provided as an IC, and may be mounted on a control PCB. The control PCB may be connected to the PCB to control the gate driver 120 and the data driver 130. The control PCB may supply power to the pad part 300.

Figure 3:
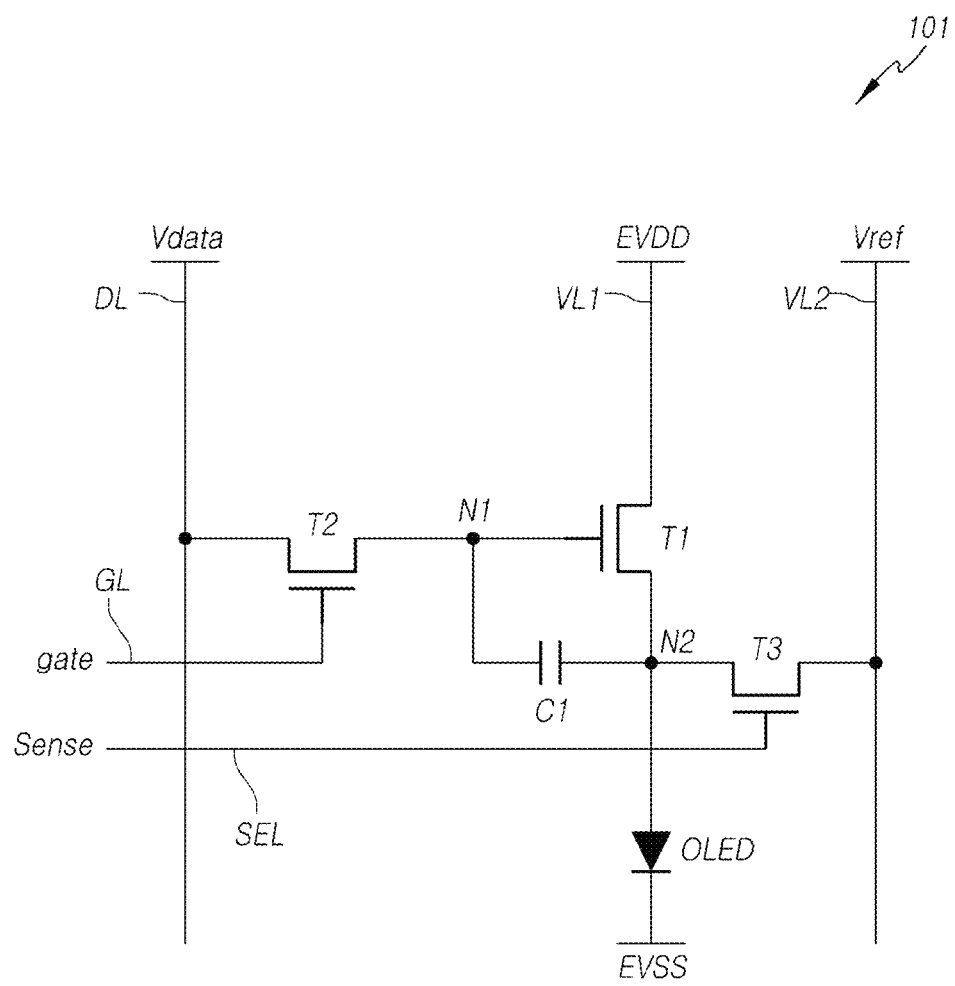
FIG. 3 is a circuit diagram illustrating an exemplary pixel used in the display device illustrated in FIG. 2.

FIG. 3 is a circuit diagram illustrating an exemplary pixel used in the display device illustrated in FIG. 2.

Referring to FIG. 3, the pixel 101 may include a pixel circuit including an OLED, first to third transistors T1 and T3, and a capacitor C1. The first transistor T1 may be a driving transistor supplying a driving current to the OLED.

In the first transistor T1, a first electrode may be connected to a first voltage line VL1, such that a first voltage EVDD is transferred to the first electrode, a second electrode may be connected to a second node N2, and a gate electrode may be connected to a first node N1. In the second transistor T2, a first electrode may be connected to a data line DL, a second electrode may be connected to the first node N1, and a gate electrode may be connected to a gate line GL. In the third transistor T3, a first electrode may be connected to the second node N2, a second electrode may be connected to a second voltage line VL2, and a third electrode may be connected to a sensing control signal line SEL. The sensing control signal line SEL may be a gate line GL. In the OLED, an anode may be connected to the second node N2, and a second voltage EVSS may be transferred to a cathode. Accordingly, a driving current supplied through the first transistor T1 may flow through the OLED. In addition, the capacitor C1 may be connected between the first node N1 and the second node N2 to maintain a voltage applied to the first node N1. The first voltage line VL1 may receive a first voltage EVDD, while the second voltage line VL2 may receive a reference voltage Vref.

FIG. 4 is a plan view illustrating an exemplary touch sensing circuit used in the display device according to exemplary embodiments.

Referring to FIG. 4, the touch sensing circuit may be disposed on the display panel 110, and may include a plurality of first electrodes TEa and a plurality of second electrodes TEb. The plurality of first electrodes TEa may correspond to touch driving electrodes TE1a, while the plurality of second electrodes TEb may correspond to touch sensing electrodes TEb. The plurality of first electrodes TEa may be connected by connectors 422 in a row direction, thereby providing a plurality of electrode rows, while the plurality of second electrodes TEb may be connected by connectors 422 in a column direction, thereby providing a plurality of electrode columns. Although the plurality of first electrodes TEa and the plurality of second electrodes TEb are illustrated as being arranged in a 4×3 matrix, the present disclosure is not limited thereto.

The first electrodes TEa can receive a touch driving signal transferred thereto, while the second electrodes TEb can transfer touch sensing signals in response to the touch driving signal. Although the first electrodes TEa and the second electrodes TEb may be provided on the same layer on the display panel 110, the present disclosure is not limited thereto.

The connectors 422 connect the first electrodes TEa to each other. In addition, the connectors 422 connect the second electrodes TEb to each other. The connectors 422 are disposed to intersect each other. To prevent the first electrodes TEa from being directly connected to the second electrodes TEb, the connectors 422, connecting the first electrodes TEa, may be provided on a different layer from the first electrodes TEa and the second electrodes TEb, and may be connected to the first electrodes TEa through electrical vias. The connectors 422, connecting the second electrodes TEb, may be provided on the same layer as the first electrodes TEa and the second electrodes TEb to connect the second electrodes TEb on the same layer. Accordingly, an insulating film (not shown) may be disposed between the connectors 422, connecting the first electrodes TEa, and the connectors 422, connecting the second electrodes TEb.

The first electrodes TEa and the second electrodes TEb may be fabricated by patterning a conductive metal layer. The first electrodes TEa and the second electrodes TEb may be made of a transparent material, such as indium tin oxide (ITO). When patterned, each of the first and second electrodes TEa and TEb may have a mesh-shaped electrode pattern having a plurality of open areas. Light, generated by the display device, can be emitted outwardly by passing through the first and second electrodes TEa and TEb, provided as ITO electrodes, or through the plurality of open areas of the first and second electrodes TEa and TEb.

The mesh-shaped patterns of the first electrodes TEa and the second electrodes TEb may be referred to as touch electrode lines. The first electrodes TEa and the second electrodes TEb may be connected to driving lines 421a, through which a driving signal is applied to the touch electrodes, and sensing lines 421b, through which sensing signals generated in response to a touch sensed by the touch electrodes are transferred. The driving lines 421a and the sensing lines 421b may be referred to as touch lines. The touch lines, including the driving lines 421a and the sensing lines 421b, may be connected to the pads disposed in the pad area 300, as illustrated in FIG. 1.

FIG. 5 is a plan view illustrating another exemplary touch sensing circuit used in the display device according to exemplary embodiments.

Referring to FIG. 5, the touch sensing circuit may include a plurality of touch electrodes TE respectively having a predetermined area on the display panel 110. The plurality of touch electrodes TE may be arranged in the form of a matrix. A plurality of touch lines 520 receiving touch sensing signals may be connected to the touch electrodes TE, respectively. The touch lines 520 may be disposed below the touch electrodes TE to be in contact with predetermined portions of the touch electrodes TE. Since the touch electrodes TE and the touch lines 520 may be disposed within the display panel 110, the display device does not include a separate touchscreen panel disposed on the display panel 110. Consequently, the display panel 110 can be designed to be thin.

FIG. 6 is a plan view illustrating another exemplary touch sensing circuit used in the display device according to exemplary embodiments.

Referring to FIG. 6, the touch sensing circuit may include first touch electrodes TEd1, TEd2, . . . , TEdn−1, and TEdn arranged in a row direction on the display panel 110 and second touch electrodes TEs1, TEs2, . . . , TEds−1, and TEds arranged in a column direction on the display panel 110. The first touch electrodes TEd1, TEd2, . . . , TEdn−1, and TEdn arranged in a row direction may be referred to as touch driving electrodes, while the second touch electrodes TEs1, TEs2, . . . , TEds−1, and TEds may be reference to as touch sensing electrodes. An insulating film may be disposed between the first touch electrodes TEd1, TEd2, . . . , TEdn−1, and TEdn and the second touch electrodes TEs1, TEs2, . . . , TEds−1, and TEds, such that the first touch electrodes TEd1, TEd2, . . . , TEdn−1, and TEdn and the second touch electrodes TEs1, TEs2, . . . , TEds−1, and TEds may be capacitively coupled. The touch sensing circuit can sense a touch position by detecting changes in capacitance between the first touch electrodes TEd1, TEd2, . . . , TEdn−1, and TEdn and the second touch electrodes TEs1, TEs2, . . . , TEds−1, and TEds.

Figure 7:
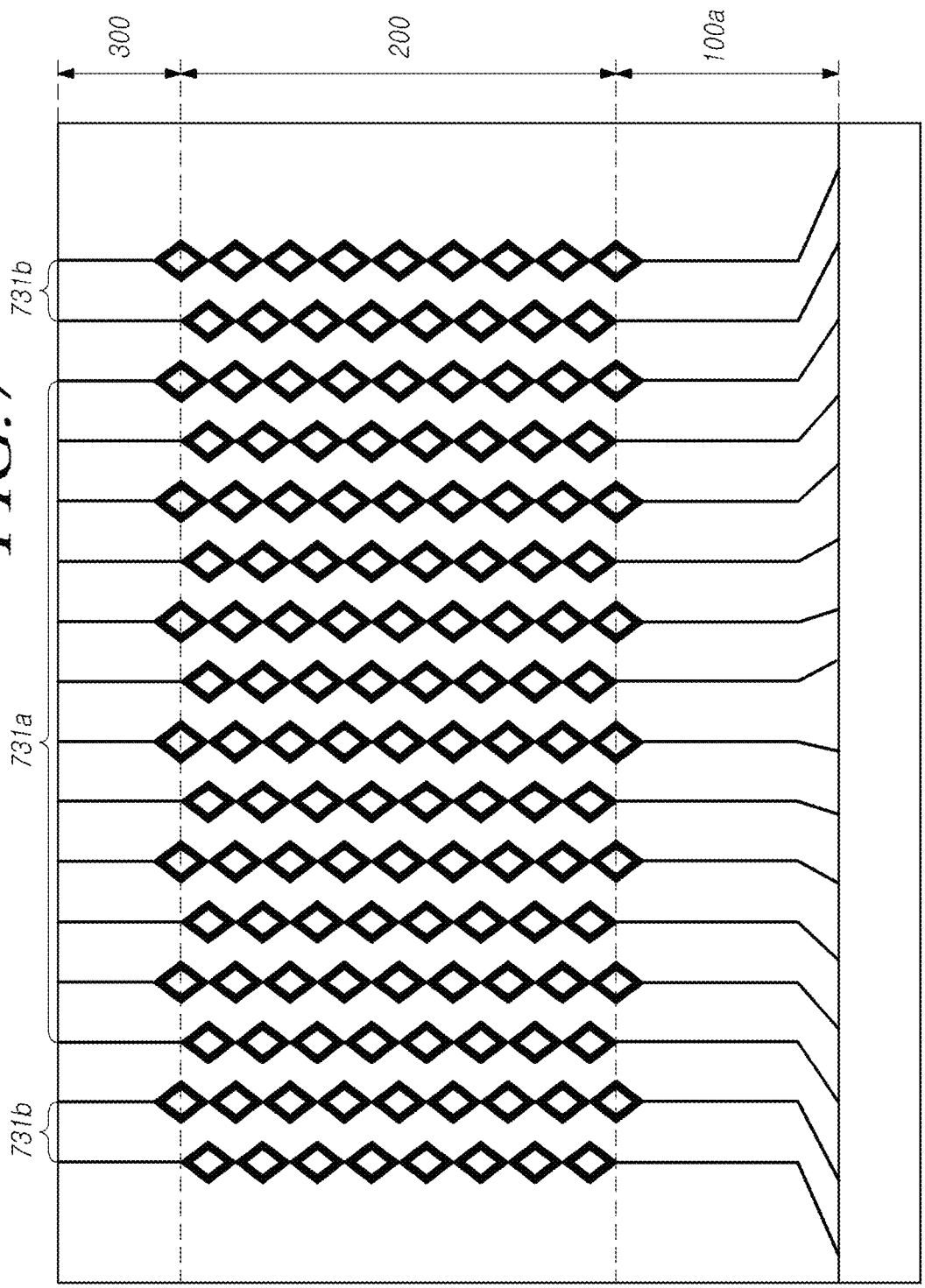
FIG. 7 is a plan view illustrating a wiring area according to exemplary embodiments.

FIG. 7 is a plan view illustrating a non-active area according to exemplary embodiments.

Referring to FIG. 7, the non-active area may include the wiring area 200 and the pad area 300. In addition, electrical lines transferring signals to an active area 100a may be disposed in one end portion of the wiring area 200. The pad area 300 may include a plurality of pads, and may be divided into a first pad area 731a and a second pad area 731b depending on signals transferred therethrough. The second pad area 731b may be disposed on both sides of the first pad area 731a. The first pad area 731a may receive signals applied to a plurality of pixels disposed in the active area 100a, while the second pad area 731b may receive signals applied to touch electrodes. However, the present disclosure is not limited thereto. A plurality of electrical lines may be disposed in the wiring area 200. The plurality of electrical lines may be ring-shaped electrical lines. However, the present disclosure is not limited thereto.

The wiring area 200 may be bendable. The bendable wiring area 200 can reduce the bezel. However, when the wiring area 200 is bent, the electrical lines disposed in the wiring area 200 may be cracked, which is problematic. To prevent this problem, the electrical lines are patterned to have the shape of a ring, with a middle portion thereof being hollow, such that the ring-shaped middle portion with no electrical line being deposited can prevent cracks from progressing. When the electrical lines are ring-shaped, even if a portion of an electrical line is broken, a signal can be transferred through another portion of the electrical line. Although the ring is illustrated as being a quadrangular ring, the present disclosure is not limited thereto.

Figure 8:
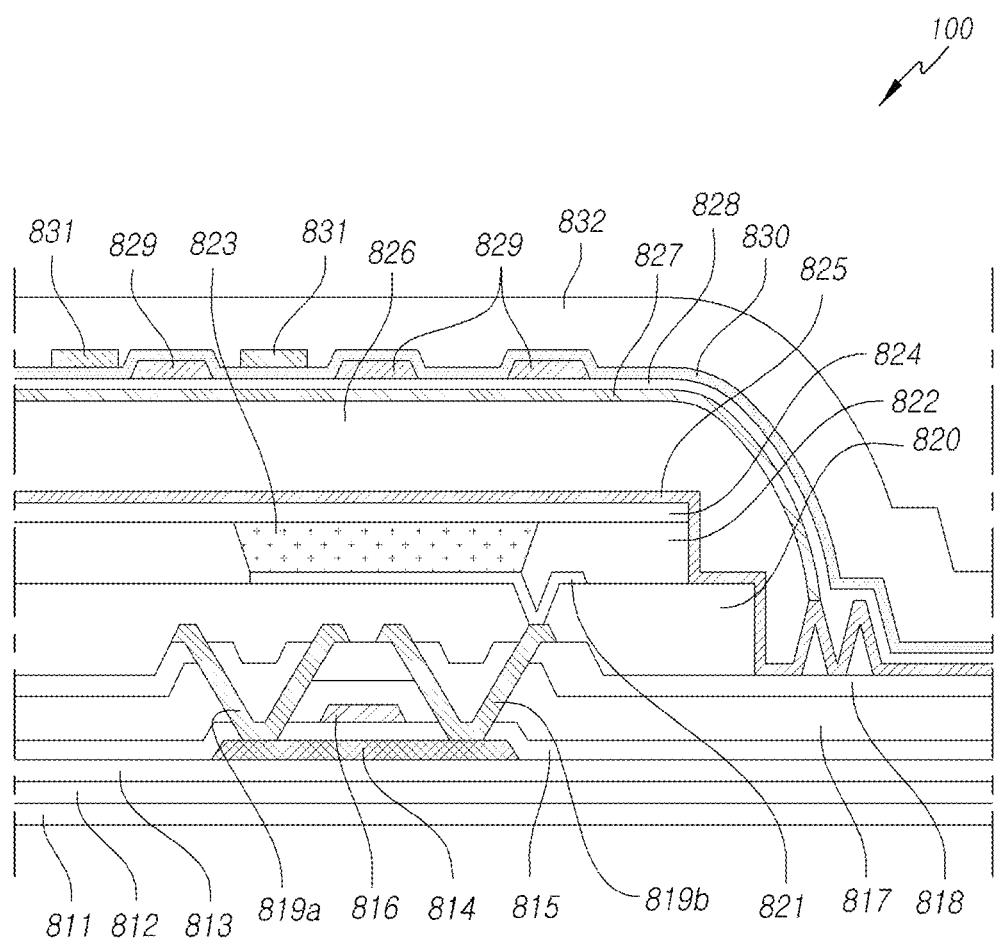
FIG. 8 is a cross-sectional view illustrating an active area according to exemplary embodiments.

FIG. 8 is a cross-sectional view illustrating an active area according to exemplary embodiments.

Referring to FIG. 8, in the active area 100, a multi-buffer layer 812 may be fabricated on a substrate 811, and an active buffer layer 813 may be fabricated on the multi-buffer layer 812. The multi-buffer layer 812 and the active buffer layer 813 may collectively be referred to as a buffer layer. The substrate 811 may contain polyamide (PI). When the substrate 811 contains polyamide, the substrate 811 may be referred to as a flexible substrate. Herein, the flexible substrate 811 may be foldable and/or bendable. An active layer 814 may be provided on the active buffer layer 813 by patterning. The multi-buffer layer 812 and the active buffer layer 813 can prevent impurities on the substrate from penetrating into the active layer 814. The multi-buffer layer 812 may be comprised of a plurality of inorganic films respectively containing silicon dioxide ($SiO_2$) and silicon nitride (SiNx). The active buffer layer 813 may include an inorganic film containing silicon dioxide.

A gate insulating film 815 may be disposed on the active layer 814. A gate metal may be patterned on the gate insulating film 815, thereby providing a gate electrode 816. The gate insulating film 815 may contain silicon dioxide. A first interlayer insulating film 817 and a second interlayer insulating film 818 may be disposed on the gate electrode 816. The first interlayer insulating film 817 may contain silicon dioxide and silicon nitride, and the second interlayer insulating film 818 may contain silicon dioxide and silicon nitride. A source electrode 819a and a drain electrode 8191b may be provided above the second interlayer insulating film 818, fabricated by patterning of a source/drain metal. A planarization film 820 may be disposed on the source electrode 819a and the drain electrode 8191b. An anode 821 may be disposed on the planarization film 820. A contact-hole may be provided in the planarization film 820, and the anode 821 may be connected to the drain electrode 919b through the contact-hole. A bank 822 may be provided on the planarization film 820, a cavity may be provided in the bank 822, and a light-emitting layer 823 may be provided in the cavity 823. The light-emitting layer 823 may include a plurality of organic light-emitting layers. A cathode 824 may be provided on the light-emitting layer 823. The cathode 824 may be a common electrode.

A sealing substrate 825, 826, and 827 may be disposed on the cathode 824. The sealing substrate 825, 826, and 827 may include a second inorganic film 825, a third inorganic film 827, and a first organic film 826 sandwiched between the second inorganic film 825 and the third inorganic film 827. The thickness of the organic film 826 may be increased to prevent impurities from penetrating into the light-emitting layer 823 through the sealing substrate 825, 826, and 827. The second inorganic film 825 may be disposed on the cathode 824, the first organic film 826 may be disposed on the second inorganic film 825, and the third inorganic film 827 may be disposed on the first organic film 826. The second inorganic film 825 may be provided with dual dams to prevent the first organic film 826 from being discharged outwardly, and one end of the third inorganic film 827 may join the dams of the second inorganic film 825.

A touch sensing circuit 829, 830, and 831 may be disposed on the sealing substrate 825, 826, and 827. In the touch sensing circuit 829, 830, and 831, first touch electrodes 829 and second touch electrodes 831 may be patterned. A touch buffer layer 828 may be disposed on the sealing substrate 825, 826, and 827 to prevent the sealing substrate from being damaged when patterning the touch electrodes and sensing electrodes. A first conductive layer may be fabricated and patterned on the touch buffer layer 828, thereby providing the first touch electrodes 829. A touch insulating film 830 may be fabricated on the first touch electrodes 829, and a second conductive layer may be fabricated and patterned on the touch insulating film 830, thereby providing the second touch electrodes 831. A passivation layer 832 may be fabricated above the second touch electrodes 831. Accordingly, the touch sensing circuit 829, 830, and 831 may be mounted on the display panel.

The first touch electrodes 829 may be one type of connectors among the connectors 422 illustrated in FIG. 4, while the second touch electrodes 831 may be the first electrodes TEa and the second electrodes TEb illustrated in FIG. 4. The first touch electrodes 829 may be the touch electrodes TE illustrated in FIG. 5, while the second touch electrodes 831 may be the touch lines 520 illustrated in FIG. 5. The first touch electrodes 829 may be the first touch electrodes TEd1, TEd2, . . . , TEdn−1, and TEdn illustrated in FIG. 6, while the second touch electrodes 831 may be the second touch electrodes TEs1, TEs2, . . . , TEds−1, and TEds illustrated in FIG. 6.

FIGS. 9A to 9E are cross-sectional views illustrating a process of fabricating a wiring area according to exemplary embodiments.

Figure 9A:
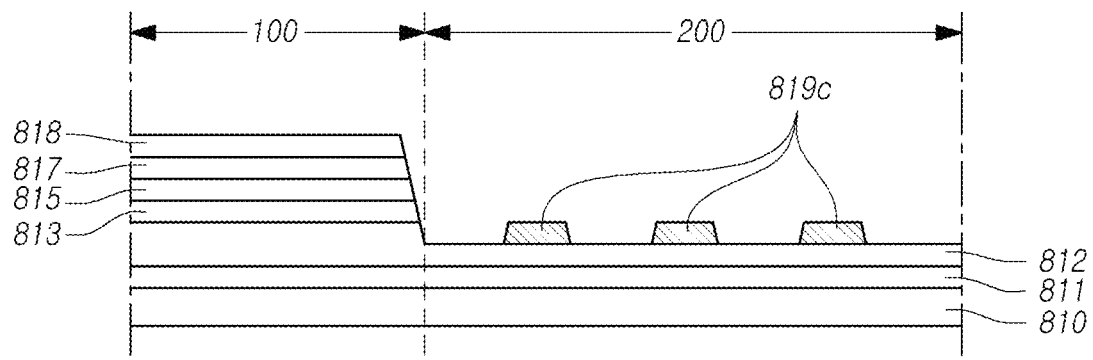
FIGS. 9A to 9E are cross-sectional views illustrating a process of fabricating a wiring area according to exemplary embodiments.

Referring to FIG. 9A, a substrate 811 may be provided on a glass sheet 810, and a multi-buffer layer 812 and an active buffer layer 813 may be fabricated on the substrate 811. The substrate 811 may be a flexible substrate, and may contain polyimide. When the substrate 81 is flexible, it is difficult or impossible to deposit a plurality of layers on the substrate 811. Accordingly, a display device may be fabricated by providing the substrate 811 on the glass sheet 810, i.e. a hard glass sheet, and when processing is finished, separating the glass sheet from the substrate 811. However, when the substrate 811 is not flexible, the glass sheet 810 may be unnecessary. In addition, the structure underlying the substrate 811 is not limited to glass.

A gate insulating film 815 may be disposed on the active buffer layer 813, and a first interlayer insulating film 817 and a second interlayer insulating film 818 may be disposed on the gate insulating film 815. The wiring area 200 may only be provided with a multi-buffer layer 812, fabricated through use of a mask, while the active area 100 may be provided with the active buffer layer 813, the gate insulating film 815, the first interlayer insulating film 817, and the second interlayer insulating film 818. The multi-buffer layer 812 may be fabricated such that the thickness thereof in the wiring area 200 is lower than the thickness thereof in the active area 100.

When a source electrode 819a and a drain electrode 819b are fabricated in the active area 100 by patterning a source/drain metal using a mask, electrical lines 819c connecting the pad area 200 and the active area 100 may be fabricated on the multi-buffer layer 812 in the wiring area 200 by patterning. Accordingly, the source electrode 819a, the drain electrode 819b, and the electrical lines 819c can be fabricated using the same mask, and thus, can be fabricated in a single process. In addition, a plurality of inorganic films may be fabricated in the active area 100, and at least one inorganic film, among the plurality of inorganic films fabricated in the active area 100, may also be disposed in the wiring area 200. Accordingly, the thickness of the inorganic film provided in the wiring area 200 may be lower than the thickness of the inorganic films provided in the active area 100.

Figure 9B:
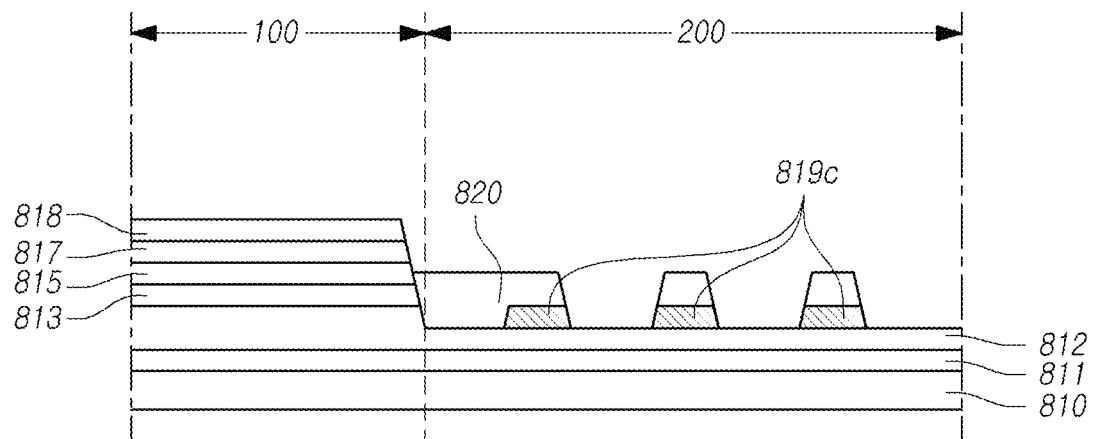

Referring to FIG. 9B, a planarization film 820 may be fabricated. The planarization film 820 may be patterned using a mask. A portion of the planarization film 820, located in the wiring area, may be patterned to conform to the configuration of the electrical lines 819c. Accordingly, the planarization film 820 may be provided above the electrical lines 819c. However, the present disclosure is not limited thereto and the planarization film 820 may not be provided in the wiring area 200. In addition, although the electrical lines 819c in the wiring area 200 are illustrated as being broken, this is only indicated by the cross-sectional view, and the present disclosure is not limited thereto.

Figure 9C:
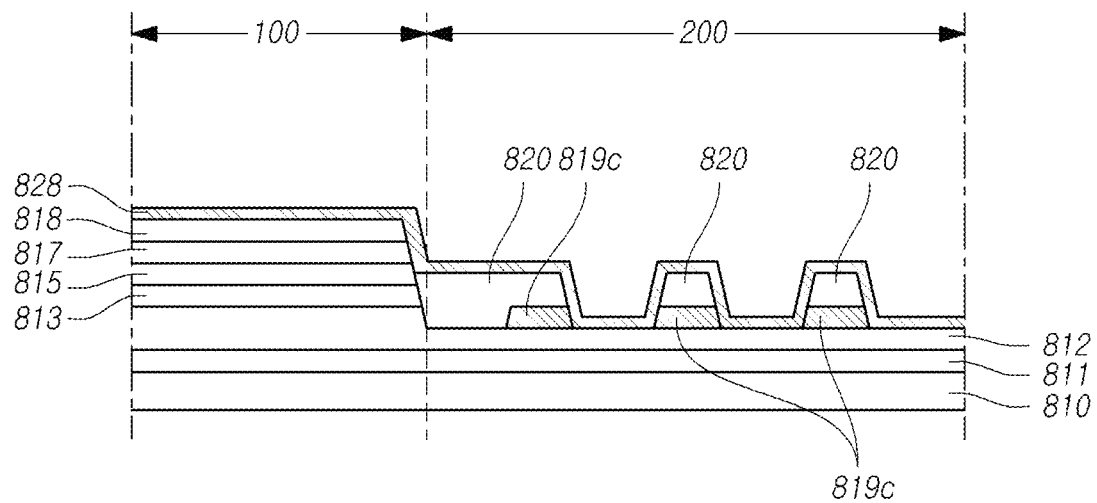

Referring to FIG. 9C, after the planarization film 820 is fabricated, a touch buffer layer 828 may be fabricated. The touch buffer layer 828 may be deposited on the entire surface of the display device, since no mask is used. The touch buffer layer 828 may be an inorganic film. In addition, the touch buffer layer 828 may be made of the same material as the multi-buffer layer 812.

Figure 9D:
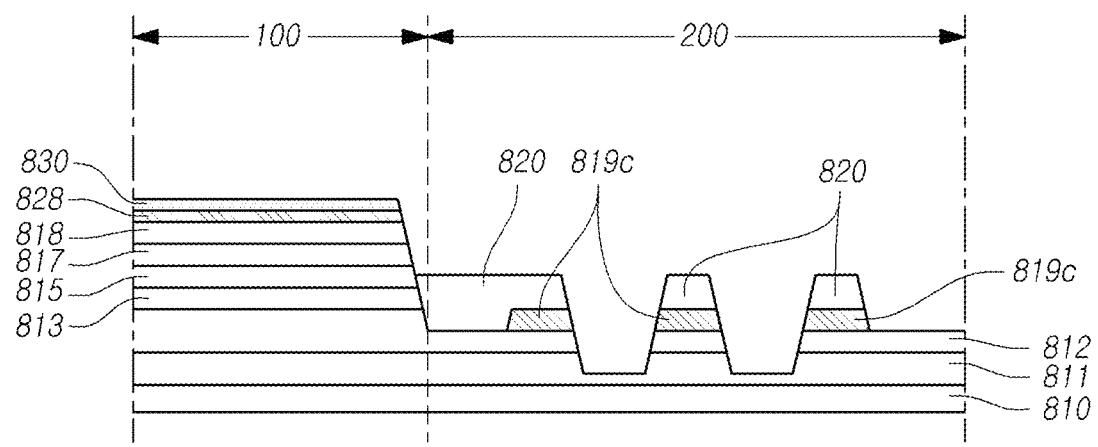

Referring to FIG. 9D, after the touch buffer layer 828 is fabricated, a touch insulating film 830 may be fabricated on the touch buffer layer 828. The touch insulating film 830 may be deposited above first touch electrodes 829 after the first touch electrodes 829 are fabricated by patterning the first metal layer illustrated in FIG. 8. A mask may be used to deposit the touch insulating film 830. A portion of the touch buffer layer 828, located in the wiring area 200 and below the touch insulating film 830, may be etched through use of the mask. During etching of the touch buffer layer 828, the multi-buffer layer 812, made of the same material as the touch buffer layer 828, may be etched. Here, the multi-buffer layer 812 is not entirely etched due to the planarization film 820 and the electrical lines 819c provided thereon, such that some portions of the multi-buffer layer 812, corresponding to regions in which the planarization film 820 and the electrical lines 819c are located, may remain while the other portions of the multi-buffer layer 812 are removed. Consequently, a portion of the substrate 811, corresponding to the wiring area 200, may be comprised of a first area on which the multi-buffer layer 812 is not provided and a second area on which the multi-buffer layer 812 is provided. The wiring area 200 may include a first area in which the multi-buffer layer 812 is not provided. Since the portion without the multi-buffer layer 812 is easily bendable, the wiring area 200 can be easily bent.

In addition, during etching of the touch buffer layer 828 and the multi-buffer layer 812, a portion of the substrate 811 may be etched, thereby reducing the thickness of the substrate 811. Accordingly, the thickness of the portion of the substrate 811, on which the electrical lines 819c are provided, may be higher than the thickness of the portion of the substrate 811, on which the electrical lines 819c are not provided.

Figure 9E:
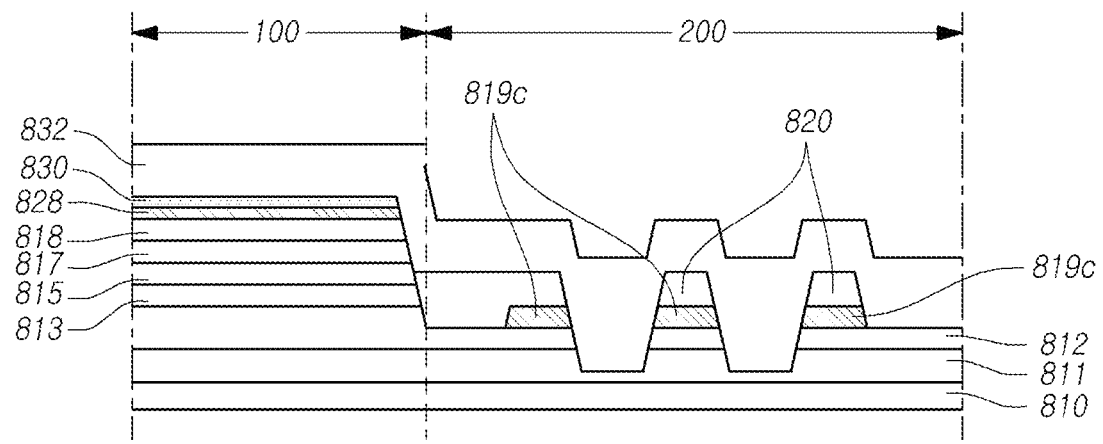

Referring to FIG. 9E, a passivation layer 832 may be deposited above the touch insulating film 830. The fabrication of the touch insulating film 830 is performed by fabricating second touch electrodes by patterning a second metal layer in the active area illustrated in FIG. 8 and depositing the passivation layer 832 above the second touch electrodes. The passivation layer 832 may be disposed to extend to the wiring area 200. The passivation layer 832 may be an organic film. The passivation layer 832 may be referred to as a first organic film or a third inorganic film.

Accordingly, the patterned electrical lines, the inorganic film, and the organic film covering the electrical lines and the inorganic film may be disposed in the wiring area 200 of the substrate 811. In addition, since an area in which neither electrical lines nor inorganic films are provided may be present on the substrate 811, the bendability of the substrate 811 can be prevented from being degraded by the electrical lines and the inorganic films.

In addition, an increase in the thickness of the organic film in the wiring area 200 may reduce cracks when the wiring area 200 is bent. This can consequently prevent the substrate 811 from being damaged when the substrate 811 is bent. However, the present disclosure is not limited thereto, and the passivation layer 832 may not be configured to extend to the wiring area. The passivation layer 832 may also be provided as an inorganic film. When the passivation layer 832 is provided as an inorganic film, the touch buffer layer 828 and the multi-buffer layer 812 in the wiring area 200 can be etched during fabrication of the passivation layer 832.

In addition, the thickness of the inorganic film, located in the active area 100, may be lower than the thickness of the inorganic film, located in the wiring area 200. The thickness of an inorganic film, deposited in the wiring area 200, may be further reduced, such that the wiring area 200 can be easily bent.

After the passivation layer 832 is fabricated, the substrate 811 may be separated from the glass sheet 810, the wiring area may be bent, and subsequent processing may be undertaken. However, the present disclosure is not limited thereto.

Figure 10:
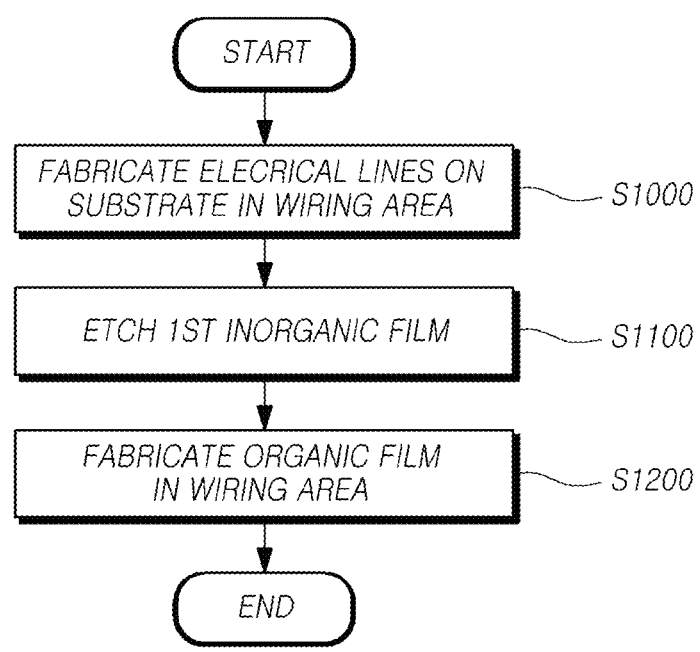
FIG. 10 is a flowchart illustrating a method of fabricating the display device according to exemplary embodiments.

FIG. 10 is a flowchart illustrating a method of fabricating the display device according to exemplary embodiments.

Referring to FIG. 10, in S1000, the electrical lines 819*c* may be fabricated on a bending area of the substrate. The substrate may include an active area 100 and a wiring area 200. A first inorganic film may be fabricated in the wiring area 200 and the electrical lines 819*c* may be fabricated on the first inorganic film in the wiring area 200 by patterning while thin-film transistors (TFTs) are being fabricated in the active area 100. The electrical lines 819*c* may be electrical lines, through which signals applied to the TFTs in the active area are transferred.

In addition, while the TFTs are being fabricated in the active area, the multi-buffer layer 812, from among the multi-buffer layer 812, the active buffer layer 813, the gate insulating film 815, the first interlayer insulating film 817, and the second interlayer insulating film 818, fabricated in the active area illustrated in FIG. 8, may only be fabricated un the wiring area through use of a mask. The multi-buffer layer 812 may be referred to as the first inorganic film. When the substrate is a flexible substrate, the TFTs may be fabricated on the substrate 811 after the substrate 811 is fabricated on a glass sheet 810. Afterwards, the planarization film 820 may be fabricated on the source electrodes 819*a* and the drain electrodes 919*b* of the TFTs, and the anodes 821 may be fabricated on the planarization film 820. The contact-holes may be fabricated in the planarization film 820 to connect the drain electrodes 919*b* and the anodes 821, respectively. The planarization film 820 may be provided on the electrical lines in the wiring area 200.

The light-emitting layer 823 may be fabricated on the anodes 821. Before formation of the light-emitting layer 823, the banks 822 may be fabricated above the planarization film 820 to provide cavities above the anodes 821, such that the light-emitting layer 823 is fabricated in the cavities. The cathodes may be fabricated above the light-emitting layer.

The sealing substrate 811 may be provided on the cathodes in the active area 100. The sealing substrate 811 may include the second inorganic film 825, the third inorganic film 827, and the first organic film 826. The thickness of the first organic film 826 may be lower than the thickness of either the second inorganic film 825 or the third inorganic film 827. When the first organic film 826 is thick, the first organic film 826 can prevent impurities from penetrating into the light-emitting layer.

In S1100, the first inorganic film may be patterned on the electrical lines in the wiring area. The first inorganic film may be etched. After the sealing substrate 811 is disposed, the touch sensing circuit 829, 830, and 831 may be fabricated. The touch sensing circuit 829, 830, and 831 may be provided on the sealing substrate 825, 826, and 827 in the process of fabricating the first touch electrodes 829 by patterning a first metal layer, fabricating the touch insulating film 830 above the first touch electrodes 829, and fabricating the second touch electrodes 831 by patterning a second metal layer on the touch insulating film. When the touch insulating film 830 is fabricated, the touch buffer layer 828 and the first inorganic film, fabricated in the wiring area 200, may be etched. The touch buffer layer 828 and the first inorganic film may contain the same material, and may be etched using the same method. Accordingly, the touch buffer layer 828 and the first inorganic film may be etched using the same mask and in a single process. Here, the first inorganic film on the substrate includes a portion on which the electrical lines and the planarization film 820 are disposed and a portion on which neither the electrical lines nor the planarization film 820 is disposed. The portion of the first inorganic film, on which the electrical lines and the planarization film 820 are present, may not be etched, whereas the portion of first inorganic film, on which neither the electrical lines nor the planarization film 820 is present, may be etched. The first inorganic film may be a multi-buffer layer. However, the present disclosure is not limited thereto. In addition, the first inorganic film of the wiring area 200 may be etched, allowing the wiring area 200 to be easily bent.

In S1200, the organic film may be fabricated in the wiring area 200. The first inorganic film in the wiring area 200 may be etched, thereby exposing the substrate 811. When the organic film is fabricated on the portion in which the substrate 811 is exposed, the possibility of cracks may be reduced even in the case in which the wiring area 200 is bent. When the passivation layer is fabricated as the organic film after fabrication of the touch sensing circuit, the passivation layer may be fabricated to extend from the active area to the wiring area, thereby providing the organic film in the wiring area. However, the present disclosure is not limited thereto.

It will be apparent to those skilled in the art that various modifications and variations can be made in the display device and the method of fabricating the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
    an active area provided on a substrate and having pixels defined therein;
    a pad area provided on the substrate to receive signals to be transferred to the active area; and
    a wiring area provided on the substrate, with electrical lines being disposed therein to connect the active area and the pad area,
    wherein an inorganic film is disposed in the active area and the wiring area, with a thickness of a portion of the inorganic film in the wiring area being lower than a thickness of a portion of the inorganic film in the active area,
    wherein the electrical lines in the wiring area are patterned,
    wherein the inorganic film or a first inorganic film of the inorganic film is disposed below the electrical lines to conform to a configuration of the electrical lines,
    wherein a thickness of a portion of the substrate in the wiring area, on which the electrical lines are disposed, is higher than a portion of the substrate in the wiring area, on which none of the electrical lines are disposed.

2. The display device according to claim 1, wherein a first organic film is provided between the patterned electrical lines.

3. The display device according to claim 1, wherein the active area comprises pixel areas corresponding to the pixels and respectively comprising a transistor and a light-emitting layer, a sealing substrate provided on the pixel areas, and a touch sensing circuit disposed on the sealing substrate.

4. The display device according to claim 3, wherein the sealing substrate comprises a second inorganic film, a second organic film disposed on the second inorganic film, and a third inorganic film disposed on the second organic film.

5. The display device according to claim 3, wherein the touch sensing circuit comprises a plurality of touch electrodes and a third organic film disposed on the plurality of touch electrodes.

6. The display device according to claim 5, wherein the third organic film extends to the wiring area.

7. The display device according to claim 5, wherein the plurality of touch electrodes comprises first touch electrodes and second touch electrodes disposed above the first touch electrodes and insulated by a touch insulating film.

8. The display device according to claim 1, wherein the electrical lines comprise at least one ring shape.

9. The display device according to claim 3, wherein the electrical lines are made of a same metal as source/drain electrodes of the transistor.

10. A display device, comprising:
a substrate having defined thereon an active area and a wiring area, wherein a first inorganic film is disposed in the active area and the wiring area, the first inorganic film in the wiring area being patterned, such that the wiring area comprises a first area in which the first inorganic film is not disposed and a second area in which the first inorganic film is disposed;
a transistor disposed in the active area;
a light-emitting layer connected to the transistor; and
a sealing substrate sealing the light-emitting layer,
wherein a thickness of a portion of the substrate in the first area is lower than a thickness of a portion of the substrate in the second area.

11. The display device according to claim 10, wherein the sealing substrate comprises a second inorganic film, a third inorganic film, and a second organic film disposed between the second inorganic film and the third inorganic film.

12. The display device according to claim 11, comprising a plurality of touch electrodes disposed on the third inorganic film and a third organic film disposed on the plurality of touch electrodes, the third organic film extending to the wiring area.

13. A method of fabricating a display device, comprising:
fabricating electrical lines in a wiring area on a substrate on which a first inorganic film is provided;
etching the wiring area in which the electrical lines are fabricated, thereby etching the first inorganic film;
fabricating a first organic film on the electrical lines;
fabricating a display panel in the active area on the substrate; and
fabricating a touch sensing circuit on the display panel,
wherein fabricating the touch sensing circuit comprises:
fabricating first touch electrodes on the display panel,
fabricating a touch insulating film on the first touch electrodes, and
fabricating second touch electrodes above the touch insulating film, and
wherein the touch insulating film is fabricated using a same mask used for etching the first inorganic film.

14. The method according to claim 13, wherein:
fabricating the display panel comprises fabricating a sealing substrate; and
the touch electrodes are fabricated on the sealing substrate.

* * * * *